(12) United States Patent
Yamanaka et al.

(10) Patent No.: US 7,673,281 B2
(45) Date of Patent: Mar. 2, 2010

(54) PATTERN EVALUATION METHOD AND EVALUATION APPARATUS AND PATTERN EVALUATION PROGRAM

(75) Inventors: Eiji Yamanaka, Tokyo (JP); Masamitsu Itoh, Yokohama (JP); Mitsuyo Asano, Yokohama (JP); Shinji Yamaguchi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 229 days.

(21) Appl. No.: 11/878,018

(22) Filed: Jul. 20, 2007

(65) Prior Publication Data

US 2008/0028361 A1 Jan. 31, 2008

(30) Foreign Application Priority Data

Jul. 25, 2006 (JP) ............... 2006-202384

(51) Int. Cl.
*G06F 17/50* (2006.01)
(52) U.S. Cl. .......................... 716/21; 716/19
(58) Field of Classification Search ................... 716/19, 716/21
See application file for complete search history.

(56) References Cited

U.S. PATENT DOCUMENTS

| 6,067,375 | A * | 5/2000 | Tsudaka ..................... 382/144 |
| 7,496,881 | B2 * | 2/2009 | Green ......................... 716/19 |
| 2003/0140330 | A1 * | 7/2003 | Tanaka et al. ................. 716/19 |
| 2004/0158808 | A1 * | 8/2004 | Hansen ........................ 716/21 |
| 2005/0068515 | A1 * | 3/2005 | Bauch et al. .................. 355/77 |
| 2005/0238221 | A1 | 10/2005 | Hirano et al. |
| 2005/0265592 | A1 | 12/2005 | Asano et al. |
| 2007/0150850 | A1 | 6/2007 | Itoh |

FOREIGN PATENT DOCUMENTS

| JP | 2001-101414 | 4/2001 |
| JP | 2001-183810 | 7/2001 |
| JP | 2001-183811 | 7/2001 |
| JP | 2003-43666 | 2/2003 |

OTHER PUBLICATIONS

Wang, et al., "Mask pattern fidelity quantification method", Proceedings of SPIE, vol. 5256, 23rd Annual BACUS Symposium on Photomask Technology, pp. 266-275, (2003).

* cited by examiner

*Primary Examiner*—Stacy A Whitmore
*Assistant Examiner*—Magid Y Dimyan
(74) *Attorney, Agent, or Firm*—Finnegan, Henderson, Farabow, Garrett & Dunner, L.L.P.

(57) ABSTRACT

A pattern evaluation method for evaluating a mask pattern includes generating desired wafer pattern data corresponding to the evaluation position of a mask pattern, generating mask pattern contour data based on an image of the mask pattern, and performing a lithography/simulation process based on the mask pattern contour data and generating predicted wafer pattern data when the mask pattern is transferred to a wafer. Further, it includes deriving positional offset between the mask pattern contour data and mask pattern data, correcting a positional error between the desired wafer pattern data and the predicted wafer pattern data based on the positional offset, and comparing the desired wafer pattern data with the predicted wafer pattern data with the positional error corrected.

13 Claims, 5 Drawing Sheets

PATTERN EVALUATION METHOD AND EVALUATION APPARATUS AND PATTERN EVALUATION PROGRAM

CROSS-REFERENCE TO RELATED APPLICATIONS

This application is based upon and claims the benefit of priority from prior Japanese Patent Application No. 2006-202384, filed Jul. 25, 2006, the entire contents of which are incorporated herein by reference.

BACKGROUND OF THE INVENTION

1. Field of the Invention

This invention relates to a pattern evaluation method and evaluation apparatus which evaluate a mask pattern formed on an exposure mask. Further, this invention relates to a pattern evaluation program which causes a computer to evaluate a mask pattern. In addition, this invention relates to a manufacturing method of a semiconductor device for forming a pattern on a semiconductor substrate by use of a mask which is determined to be an acceptable product by the above evaluation method or apparatus.

2. Description of the Related Art

In a process of manufacturing large-scale integrated circuits (LSIs), a method for transferring a pattern formed on an exposure mask to a wafer by use of the photolithography technique is generally used. With recent developments in the pattern miniaturizing process, the wavelength used for transfer has become almost equal to the pattern line width and the degree of difficulty in forming a desired pattern on a wafer is rapidly increasing. In order to cope with this problem, in the photolithography, the light phase effect is utilized or the optical proximity effect correction (OPC) method which corrects a variation in a transfer pattern caused by an influence of a proximity pattern is used.

Miniaturization of the pattern and increased complexity of the pattern due to the optical proximity effect correction increases an influence exerted by the mask pattern on a pattern formed on the wafer via the photolithography. For example, it becomes impossible to neglect a dimensional difference between the line width of the mask pattern and a desired value and a minute difference in the mask pattern caused by an error in the manufacturing process. Further, a large number of fine step differences are formed on the pattern by the optical proximity effect correction method and the area of a portion with a simple linear form becomes less. Therefore, conventionally, it becomes difficult to measure and manage the line width.

Based on the above condition, a method for evaluating a mask pattern by performing the lithography/simulation process is proposed (W. C. Wang et al. "Mask pattern fidelity quantification method" SPIE Vol. 5256 (2003) pp. 266 to 275). In the above method, an image of a mask pattern actually formed is acquired by use of a scanning secondary electron microscope (SEM) and a pattern contour is extracted from the image. Then, the lithography/simulation process is performed based on the pattern contour to evaluate the mask pattern according to whether or not desired lithography tolerance is obtained or whether or not a predictable wafer pattern has a form within a preset range.

However, the following problem occurs in the above type of method. That is, when the mask pattern is evaluated, a pattern contour is extracted from the image of the mask pattern and then the lithography/simulation process is performed based on the pattern contour to acquire predicted wafer pattern data. At the same time, desired wafer pattern data is acquired based on design data. Then, it is necessary to compare the above data items. At this time, it is difficult to align the predicted wafer pattern with the desired wafer pattern and it becomes impossible to precisely compare the predicted wafer pattern with the desired wafer pattern. As a result, there occurs a problem that the precision of the pattern evaluation process is lowered.

BRIEF SUMMARY OF THE INVENTION

According to one aspect of the present invention, there is provided a pattern evaluation method for evaluating a mask pattern, comprising specifying an evaluation position of a to-be-evaluated portion of a mask pattern formed on an exposure mask, generating desired wafer pattern data indicating a desired form of a wafer transfer pattern corresponding to the evaluation position based on design data used to form the exposure mask, acquiring an image of a mask pattern corresponding to the evaluation position, generating mask pattern contour data based on the acquired image of the mask pattern, deriving positional offset between the mask pattern contour data and mask pattern data corresponding to the evaluation position obtained based on the design data, performing a lithography/simulation process based on the mask pattern contour data and generating predicted wafer pattern data indicating a form of a wafer transfer pattern when the mask pattern is transferred to a wafer, correcting a positional error between the desired wafer pattern data and the predicted wafer pattern data based on the positional offset, and comparing the desired wafer pattern data with the predicted wafer pattern data with the positional error corrected.

According to another aspect of the present invention, there is provided a pattern evaluation method for evaluating a mask pattern, comprising specifying an evaluation position of a to-be-evaluated portion of a mask pattern formed on an exposure mask, generating desired wafer pattern data indicating a desired form of a wafer transfer pattern corresponding to the evaluation position based on design data used to form the exposure mask, acquiring an image of a mask pattern corresponding to the evaluation position, generating mask pattern contour data based on the acquired image of the mask pattern, deriving positional offset between the mask pattern contour data and mask pattern data corresponding to the evaluation position obtained based on the design data, adding the positional offset value to coordinate values of a line of points configuring the mask pattern contour data, performing a lithography/simulation process based on the mask pattern contour data having the positional offset value added thereto and generating predicted wafer pattern data indicating a form of a wafer transfer pattern when the mask pattern is transferred to a wafer, and comparing the desired wafer pattern data with the predicted wafer pattern data.

According to still another aspect of the present invention, there is provided a pattern evaluation apparatus which evaluates a mask pattern, comprising an evaluation position input section which inputs an evaluation position corresponding to a to-be-evaluated position of a mask pattern formed on an exposure mask, a wafer pattern input section which inputs desired wafer pattern data indicating a desired form of a wafer transfer pattern corresponding to the evaluation position, a mask pattern input section which inputs mask pattern data corresponding to the evaluation position, an image acquiring section which acquires an image of a mask pattern corresponding to the evaluation position, a contour data generating section which generates mask pattern contour data based on the acquired image of the mask pattern, an offset calculating section which derives positional offset between the mask pattern data and the mask pattern contour data, a predicted wafer pattern data generating section which performs a lithography/simulation process based on the mask pattern contour data and generates predicted wafer pattern data indicating a form of the wafer transfer pattern when the mask pattern is transferred to a wafer, a correcting section which corrects a positional error between the desired wafer pattern data and the predicted wafer pattern data based on the positional offset, and a comparison section which compares the desired wafer pattern data with the predicted wafer pattern data with the positional error corrected.

According to another aspect of the present invention, there is provided a pattern evaluation apparatus which evaluates a mask pattern, comprising an evaluation position input section which inputs an evaluation position corresponding to a to-be-evaluated position of a mask pattern formed on an exposure mask, a wafer pattern input section which inputs desired wafer pattern data indicating a desired form of a wafer transfer pattern corresponding to the evaluation position, a mask pattern input section which inputs mask pattern data corresponding to the evaluation position, an image acquiring section which acquires an image of a mask pattern corresponding to the evaluation position, a contour data generating section which generates mask pattern contour data based on the acquired image of the mask pattern, an offset calculating section which derives positional offset between the mask pattern data and the mask pattern contour data, an offset adding section which adds the positional offset to coordinate values of a line of points configuring the mask pattern contour data, a predicted wafer pattern data generating section which performs a lithography/simulation process based on the mask pattern contour data having the positional offset added thereto and generates predicted wafer pattern data indicating a form of the wafer transfer pattern when the mask pattern is transferred to a wafer, and a comparison section which compares the desired wafer pattern data with the predicted wafer pattern data.

According to still another aspect of the present invention, there is provided a recording medium having a pattern evaluation program stored therein and read by a computer, the program causing the computer to perform the following processes of generating desired wafer pattern data indicating a desired form of a wafer transfer pattern corresponding to an evaluation position of a to-be-evaluated portion of a mask pattern formed on an exposure mask, generating mask pattern contour data based on an image of a mask pattern corresponding to the evaluation position, deriving positional offset between the mask pattern contour data and mask pattern data corresponding to the evaluation position, performing a lithography/simulation process based on the mask pattern contour data and generating predicted wafer pattern data indicating a form of a wafer transfer pattern when the mask pattern is transferred to a wafer, correcting a positional error between the desired wafer pattern data and the predicted wafer pattern data based on the positional offset, and comparing the desired wafer pattern data with the predicted wafer pattern data with the positional error corrected.

DETAILED DESCRIPTION OF THE INVENTION

Reference Example

Figure 4:
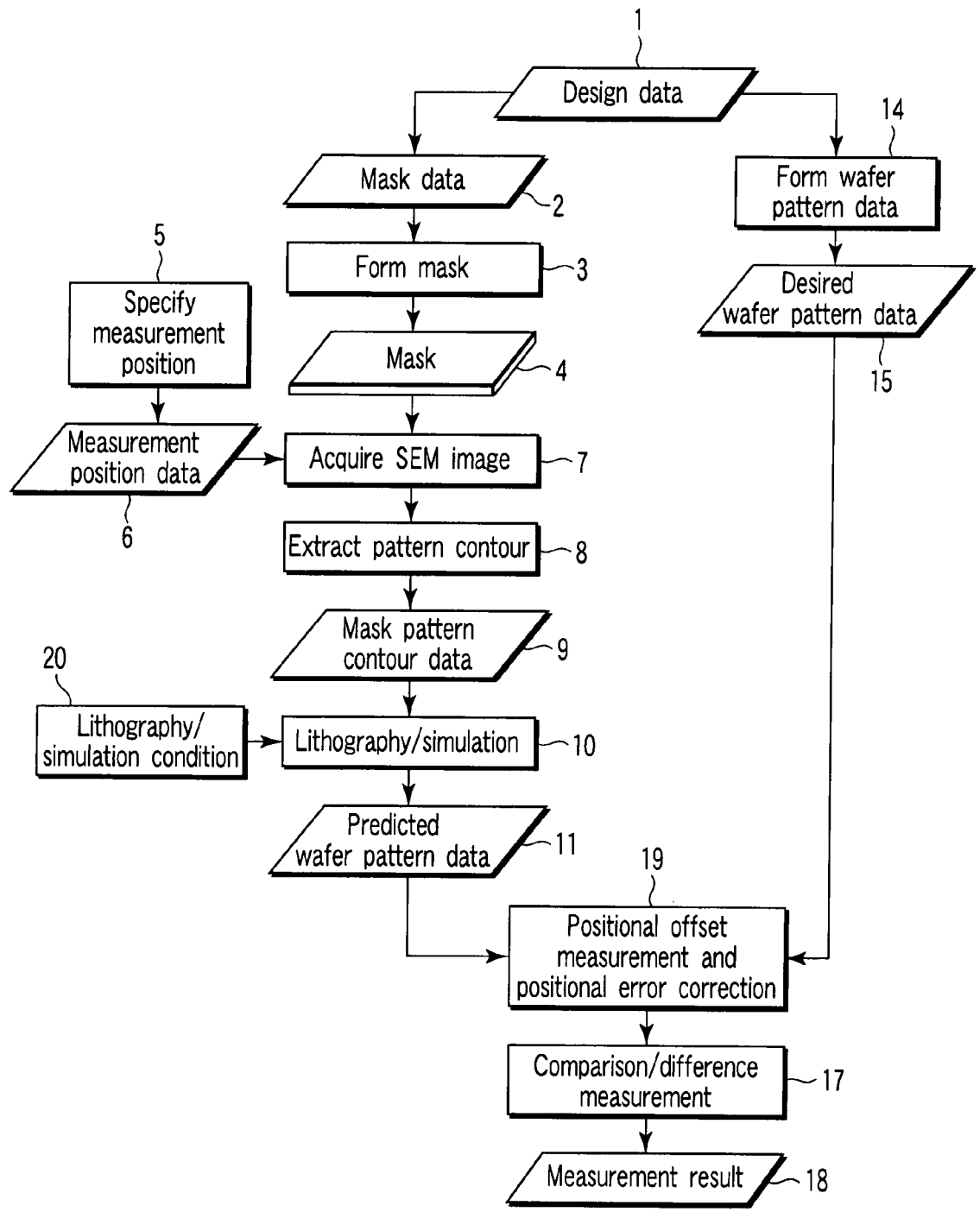
FIG. 4 is a flowchart for illustrating a basic processing procedure of a mask pattern evaluation method as a reference example which can be estimated from the conventional technique.

A pattern evaluation method which can be estimated from the conventional technique is explained as a reference example of this invention with reference to the flowchart of FIG. 4 and the pattern schematic views of FIGS. 5A to 5F before explaining the embodiment of this invention.

First, as the preparation stage, mask data 2 is created based on LSI design data 1 by an OPC process or a process for a conversion difference in the mask manufacturing process and an exposure mask 4 is formed based on the mask data. Further, desired wafer pattern data 15 is created by a process based on the lithography design according to the LSI design data 1. In addition, a location in which pattern evaluation is performed is selected and prepared as measurement positional data 6.

Next, as the measurement stage, a portion based on the measurement positional data 6 of the exposure mask 4 is checked by use of a secondary electron scanning microscope (SEM) and a step 7 of acquiring an SEM image is performed. A process of pattern contour extraction 8 is performed based on the thus acquired image to generate mask pattern contour data 9. Then, a lithography/simulation process 10 is performed with the mask pattern contour data 9 used as input data on a basis of a lithography/simulation condition 20, and acquire predicted wafer pattern data 11.

Finally, a comparison/measurement process is performed. In this case, offset occurs with respect to the position of the measurement positional data 6 in the image of a mask pattern used as a basis to generate predicted wafer pattern data 11 due to a difference in the stage position of the SEM apparatus in the SEM image acquisition process 7. Therefore, the positional error is corrected in the positional offset measurement and positional error correction process 19. After the positional error correction process 19, the comparison/difference measurement process 17 for the predicted wafer pattern data and desired pattern data 15 is performed and the measurement result 18 is output.

Figure 5A:
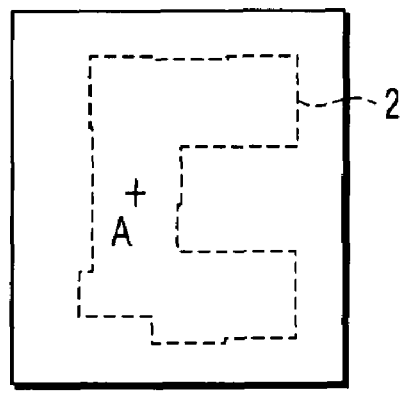
FIGS. 5A to 5F are schematic views showing the states of positional errors and corrections thereof in the flowchart of FIG. 4.
Figure 5B:
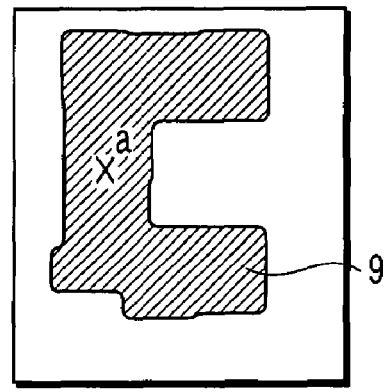

The positional offset measurement and positional error correction process is further explained with reference to FIGS. 5A to 5F. FIGS. 5A to 5F are drawn according to the flow of the processes described above. FIG. 5A shows an example of a to-be-measured pattern of the mask pattern data 2. A mark is set on a point A to explain the positional error correction result which will be described later. FIG. 5B shows the result obtained a pattern contour (mask pattern contour data 9) is acquired according to an SEM image of a pattern on an exposure mask actually formed based on the mask pattern data 2 of FIG. 5A. The image is slightly deviated towards the upper left side and this shows a shift due to the stage positional error of the SEM apparatus. In FIG. 5B, a point "a" is indicated as a mark for explanation of the positional error correction result which will be described later. Further, the pattern is shown in a hatched form for convenience of explanation, but it has no special meaning in the actual process.

Figure 5C:
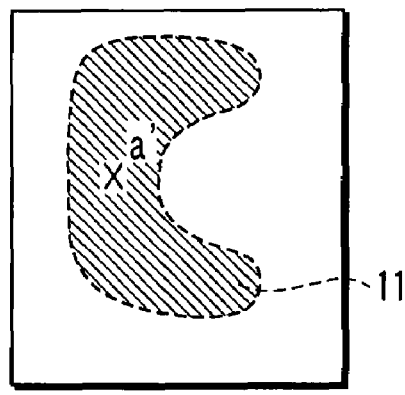
Figure 5D:
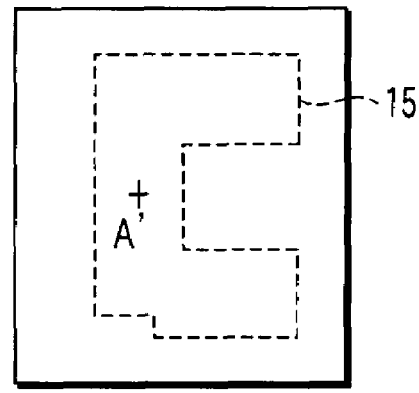

FIG. 5C shows a wafer transfer pattern (predicted wafer pattern data) 11 predicted as the result obtained when the lithography/simulation process is performed based on the mask pattern data 2 of FIG. 5B. A point "a'" corresponding to the point "a" of the mask pattern contour data 9 is attached. FIG. 5D shows desired wafer pattern data 15 which corresponds to the other one of the pattern data items subjected to the comparison/measurement process. A point "A'" is attached to the pattern data as a mark. This indicates a position corresponding to the point "A" of the mask pattern data of FIG. 5A.

Figure 5E:
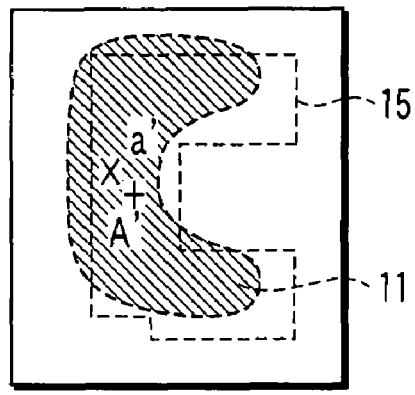

FIG. 5E shows the state of the positional offset measurement process and the state is obtained by simply superimposing the predicted wafer transfer pattern 11 of FIG. 5C on the desired wafer pattern 15 of FIG. 5D. Positional offset occurs between the two data items due to the positional error caused at the SEM image acquisition time explained in FIG. 5B. The positional difference between the points "A'" and "a'" corresponds to the above offset.

It should be noted here that the forms of the two data items are greatly different. Since the desired wafer pattern data 15 is formed of design data represented in a rectangular form, it tends to become a pattern which is much more similar to a rectangle even if it is subjected to a process for rounding the pattern corner portions thereof. However, the wafer transfer pattern 11 is greatly changed and comes to have a form in which round portions and fine step difference portions lying in the original data are difficult to detect. This is significant in recent years in which the patterns are miniaturized.

Figure 5F:
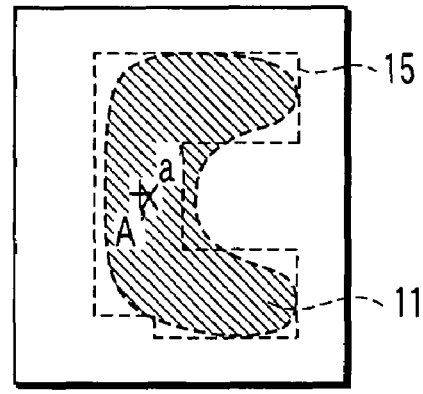

FIG. 5F shows the result of the positional error correction. Various methods are proposed and used for the above patterns having different forms by setting the centers of gravity of the patterns at the same point, for example. However, there occurs a problem how to enhance the precision because of the high degree of difficulty due to the difference in form. Particularly, the problem is that the positional error correction process required in the measurement process is not to minimize the difference between the two patterns of FIG. 5E but to correct the positional error caused at the SEM image acquisition time of FIG. 5B.

For example, if the pattern which is laterally symmetrical is used as in the example of FIG. 5, the deformation amounts of the wafer transfer pattern are different on the right and left sides thereof. Since the rounded portion of the pattern on the right side in this example is made extremely short, the results obtained when the positional errors at the respective centers of gravity are corrected become different. It is understood that the point "a'" is shifted in the right direction with respect to the point "A'" of FIG. 5F due to the difference between the deformation amounts on the right and left sides thereof.

When manufacturing semiconductor devices, not only the line widths of patterns but also positions in which the patterns are formed are important. For example, if the positions of the pattern of a wiring layer and the pattern of a contact-hole layer are shifted from each other, a poor connection and a short are caused. In the mask pattern evaluation/measurement process described above, it becomes necessary to precisely measure the positions of patterns containing the position of the predicted wafer transfer pattern, but it cannot be realized with the pattern evaluation method of FIG. 4.

In order to solve the above problem, this invention is obtained by further improving the pattern evaluation method of FIG. 4.

Embodiment

There will now be described in detail an embodiment of this invention with reference to the accompanying drawings.

Figure 1:
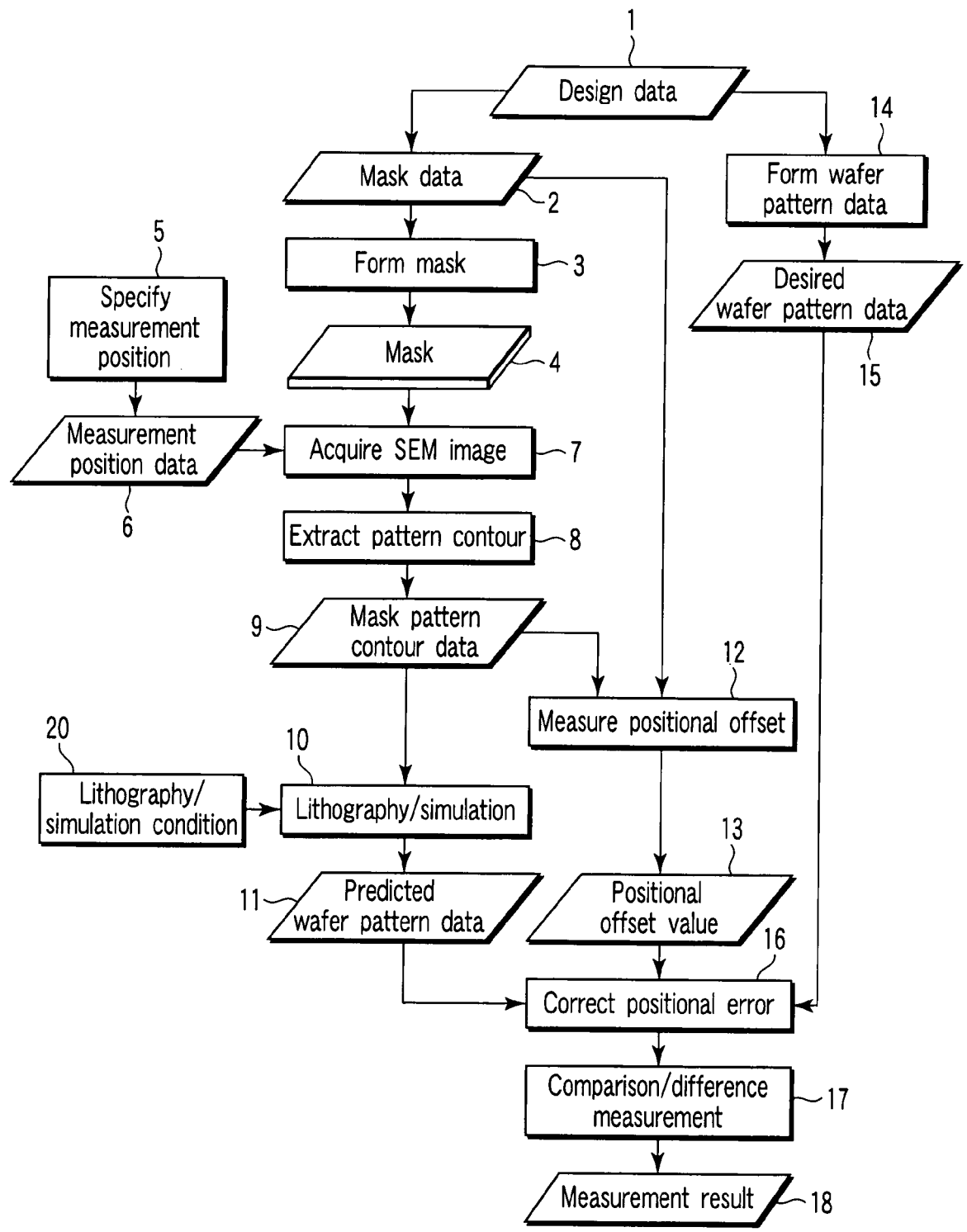
FIG. 1 is a flowchart for illustrating a basic processing procedure of a pattern evaluation method according to one embodiment of this invention.

FIG. 1 is a flowchart for illustrating a mask pattern evaluation method according to one embodiment of this invention. That is, FIG. 1 is a flowchart showing a basic process flow when a mask pattern is evaluated by extracting a pattern contour from an image of a mask pattern, predicting a wafer transfer pattern by performing the lithography/simulation process and comparing/measuring the predicted wafer transfer pattern with respect to a desired wafer pattern.

First, a process corresponding to a process for making preparation before the mask pattern evaluation method is performed is explained. In the preparation stage, three processes are required.

The first process is to actually manufacture an exposure mask 4. The process corresponds to a process of generating mask pattern data 2 by use of an OPC process or a process for a conversion difference in the mask manufacturing process based on LSI design data 1 and performing a mask manufacturing process 3 based on the mask pattern data. In the mask manufacturing process 3, for example, a mask substrate having a light shielding film formed on a transparent substrate is prepared and a pattern is drawn based on the mask pattern data 2 with resist coated on the mask substrate by use of an electronic beam drawing apparatus. After this, the resultant structure is subjected to a developing process to form a resist pattern and the light shielding film is selectively etched with the resist pattern used as a mask to form an exposure mask 4 having a mask pattern formed of a light shielding material.

The second process corresponds to a process of generating desired wafer pattern data 15 indicating the form of a desired wafer transfer pattern by performing various conversion processes based on the lithography design according to the LSI design data as a wafer pattern data creation process 14.

The third process corresponds to a process 5 of selecting a measurement location in which the pattern evaluation process is performed and preparing the same as measurement position data 6. The measurement portion selecting process is a method conventionally used when the lithography design is carried out. For example, as the above method, a method for extracting a portion in which the pattern line width is small by use of the geometrical process or a method for extracting a portion in which the line width becomes smaller than a specified value based on the result obtained when the wafer transfer result is estimated by the lithography/simulation process is used.

Next, the measurement stage is reached. First, the SEM image acquisition process 7 is performed for a portion based on the measurement position data 6 of the exposure mask 4 formed. Various means for acquiring images such as optical images are provided as the image acquisition means, but in this example, an excellent secondary electron scanning microscope (SEM) with high resolution is used as an example. A pattern contour extraction process 8 is performed based on the acquired image to generate mask pattern contour data 9. Further, the lithography/simulation process 10 is performed by using the mask pattern contour data 9 as input data on the basis of the lithography/simulation condition 20, and acquires predicted wafer pattern data 11 indicating a wafer pattern obtained when the mask pattern is transferred to the wafer. At this time, in order to more precisely predict the pattern, it is desirable to provide parameters relating to the resist and illumination condition when the pattern is actually transferred to the lithography/simulation condition 20.

The process flow explained so far is substantially the same as the example of FIG. 4 shown as the reference example. In the present embodiment, the precise measurement process containing the process of measuring the position in the comparison/measurement process explained below is realized and the process after the above process becomes important.

First, a positional offset measuring process 12 is performed for offset between the mask pattern data 2 and the mask pattern contour data 9 acquired by performing the pattern contour extraction process 8 based on the image of the mask pattern. A positional offset value 13 obtained at this time is recorded.

Then, the measurement stage is reached. First, a correction process 16 for a positional error between the predicted wafer pattern data 11 and the desired wafer pattern data 15 is performed. At this time, the correction process is performed by use of the recorded positional offset value 13. Specifically, an offset value is added to the coordinate values of a line of points of one of the desired wafer pattern data 15 and predicted wafer pattern data 11.

At this time, it is not necessary to derive positional offset for the two data items of the predicted wafer pattern data 11 and desired wafer pattern data 15 and it is only required to supply an offset value obtained in the positional offset measurement process 12 to one of the two data items. This is based on the following reason. That is, this is because the predicted wafer pattern data 11 is derived by calculation based on the mask pattern contour data 9 by the lithography/simulation process, and therefore, no positional error occurs between the mask pattern contour data 9 and the predicted wafer pattern data 11. Further, this is because both the desired wafer pattern data 15 and mask data 2 are obtained by calculation based on the original design data 1, and therefore, no positional error occurs between the desired wafer pattern data 15 and the mask data 2. The reason for the offset value obtained for the position offset measurement is that it becomes equivalent to the predicted wafer pattern data 11 and the desired wafer pattern data 15.

After the positional error correction process 16 is performed, the comparison/measurement process 17 is performed for the two data items and the measurement result 18 is output. As the comparison/measurement process, for example, a method for deriving a difference in lithography tolerance based on a difference in the line width of a specified portion is performed, for example. Further, when the desired wafer pattern data 15 is indicated in a preset range, whether the mask pattern is good or not is determined based on whether or not the predicted wafer pattern data 11 is inserted in the preset range.

Figure 2A:
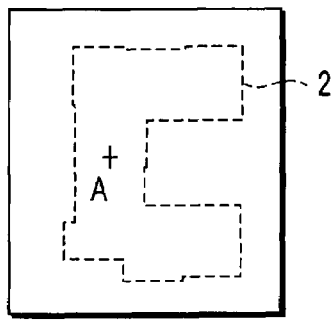
FIGS. 2A to 2G are schematic views showing the states of positional errors and corrections thereof in the flowchart of FIG. 1.
Figure 2B:
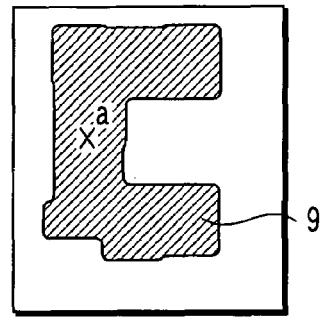

The positional offset measurement process and positional error correction process are further explained with reference to FIGS. 2A to 2G. FIGS. 2A to 2G are drawn according to the flow of the processes described above. FIG. 2A shows an example of a to-be-measured pattern of mask pattern data 2 obtained based on design data 1. For explanation of the positional error correction result which will be described later, a mark of a point "A" is attached. FIG. 2B shows the result (mask pattern contour data) 9 obtained a pattern contour is acquired according to an SEM image of a pattern on an exposure mask actually formed based on the mask pattern data 2 of FIG. 2A. The image is slightly deviated towards the upper left side and this shows a shift caused by the stage positional error of the SEM apparatus. In FIG. 2B, a point "a" is indicated as a mark for explanation of the positional error correction result which will be described later. Further, the pattern is shown in a hatched form for convenience of explanation, but it has no special meaning in the actual process.

Figure 2C:
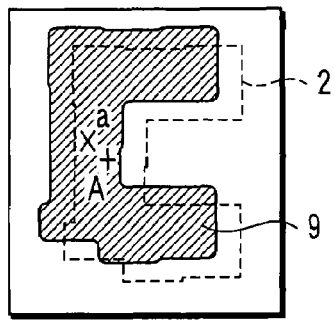

FIG. 2C shows the state of the positional offset measurement process for the mask pattern data 2 of FIG. 2A and the mask pattern contour data 9 of FIG. 2B and the state is obtained by simply superimposing the two patterns. Positional offset occurs between the two data items due to the positional error caused at the SEM image acquisition time explained in FIG. 2B. The positional difference between the points "A'" and "a'" corresponds to the above offset. Positional offsets $X_{a\text{-}A}$, $Y_{a\text{-}A}$ between the two data items are obtained as follows when the x coordinate of the point "a" is xa, the x coordinate of the point "A" is xA, the y coordinate of the point "a" is ya and the y coordinate of the point "A" is yA.

Offset $X_{a\text{-}A}$=xa−xA

Offset $Y_{a\text{-}A}$=ya−yA

Figure 2D:
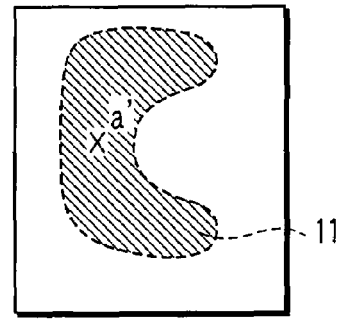

FIG. 2D shows predicted wafer pattern data indicating the form of a wafer transfer pattern predicted based on the mask pattern contour data 9 of FIG. 2B by the lithography/simulation process. A point "a'" corresponding to the point "a" of the mask pattern contour data 9 is attached.

Figure 2E:
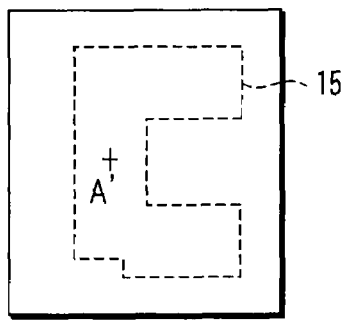

FIG. 2E shows desired wafer pattern data 15 which corresponds to the other one of the pattern data items subjected to the comparison/measurement process. A point "A'" is attached to the pattern data as a mark. This indicates a position corresponding to the point "A" of the mask pattern data 2 of FIG. 2A.

Figure 2F:
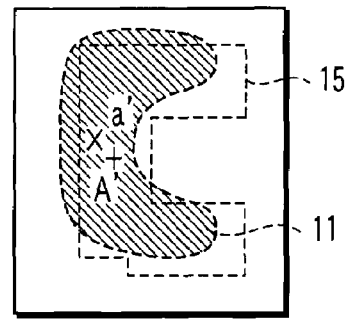

FIG. 2F shows the state before the positional error correction process in the comparison/measurement process is performed and the state is obtained by simply superimposing the predicted wafer pattern data 11 of FIG. 2D and the desired wafer pattern data 15 of FIG. 2E. Positional offset occurs between the two data items due to the positional error caused at the SEM image acquisition time explained in FIG. 2B. The positional difference between the points "A'" and "a'" corresponds to the above offset. Positional offsets $X_{a'\text{-}A'}$, $Y_{a'\text{-}A'}$ are obtained as follows when the x coordinate of the point "a'" is xa', the x coordinate of the point "A'" is xA', the y coordinate of the point "a'" is ya' and the y coordinate of the point "A'" is yA'.

Offset $X_{a'\text{-}A'}$=xa'−xA'

Offset $Y_{a'\text{-}A'}$=ya'−yA'

The two positional offsets of the positional offset $(X, Y)_{a\text{-}A}$ and positional offset $(X, Y)_{a'\text{-}A'}$ are the same. This is because the predicted wafer pattern data 11 of FIG. 2D is derived by calculation based on the mask pattern contour data 9 of FIG. 2B by the lithography/simulation process, and therefore, no positional error occurs between the mask pattern contour data 9 of FIG. 2B and the predicted wafer pattern data 11 of FIG. 2D. Further, this is because both of the mask pattern data 2 of FIG. 2A and desired wafer pattern data 15 of FIG. 2E are obtained by calculation based on the original design data, and therefore, no positional error occurs between the mask pattern data 2 of FIG. 2A and the desired wafer pattern data 15 of FIG. 2E.

That is, the positional offset $(X, Y)_{a'\text{-}A'}$ caused when the predicted wafer pattern data 11 of FIG. 2F and desired wafer pattern data 15 are simply superimposed can be eliminated by adding the positional offset $(X, Y)_{a\text{-}A}$ derived as shown in FIG. 2C thereto.

Figure 2G:
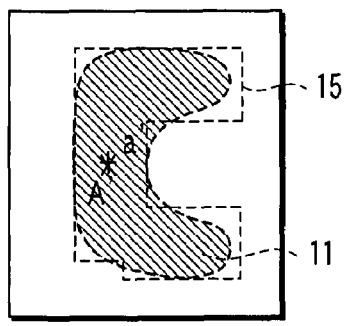

FIG. 2G shows the result of the positional error correction process. It is understood that the predicted wafer pattern data 11 and desired wafer pattern data 15 are correctly superimposed and the points "A'" and "a'" used as the marks thereof coincide with each other.

It should be noted here that the result of the positional offset measurement process for the mask pattern contour data 9 of FIG. 2C and the predicted wafer pattern data 11 is different from the result of the positional offset measurement process for the predicted wafer pattern data 9 of FIG. 2F and the desired wafer pattern data 15.

In the measurement process for positional offset between the predicted wafer pattern data 11 and the desired wafer pattern data 15 of FIG. 2F, the forms of the two data items are greatly different from each other. This is because the desired wafer pattern data 15 is formed of design data represented in a rectangular form, and therefore, it becomes a pattern which is much more similar to a rectangle even if it is subjected to a process for rounding the pattern corner portions thereof, but the predicted wafer transfer pattern 11 is greatly changed and comes to have a form in which round portions and fine step difference portions lying in the original data are difficult to detect. This has become significant in recent years as patterns are miniaturized and pattern complexity increased.

Various methods are proposed and used for the above patterns having different forms by setting the centers of gravity of the patterns at the same point. However, there occurs a problem of how to enhance the precision because of the high degree of difficulty due to the difference in form. Particularly, the problem is that the positional error correction process required in the measurement process is not to minimize the difference between the two patterns of FIG. 2E but to correct the positional error at the SEM image acquisition process of FIG. 2B. The mask pattern cannot be sufficiently evaluated by use of the methods proposed so far.

For example, if the pattern which is laterally symmetrical as shown in the example of FIG. 2 is used, the deformation amounts of the wafer transfer pattern are different on the right and left sides thereof. Since the rounded portion of the pattern on the right side in this example is made extremely short, the results obtained by correcting the positional errors at the respective centers of gravity become different. That is, the point "a'" is shifted from the original position in the right direction with respect to the point "A'" of FIG. 2F due to the difference between the deformation amounts on the right and left sides thereof.

In the measurement process for positional offset between the mask pattern data 2 and the mask pattern contour data 9 of FIG. 2C explained in the present embodiment, it is understood that the forms of the two data items are similar to each other. This is because the mask pattern is generally four or five times larger than the wafer transfer pattern and the mask pattern is drawn by use of electron beams (EB) with high resolution.

Since the forms of the two data items are similar to each other and include a large number of linear portions, the measurement process for positional offset between the two data items can be easily and precisely performed.

When manufacturing semiconductor devices, not only the line widths of patterns but also positions in which the patterns are formed are important. For example, if the positions of the pattern of a wiring layer and the pattern of a contact-hole layer are shifted from each other, a poor connection occurs. In the mask pattern evaluation/measurement process, it becomes necessary to precisely measure the positions of patterns containing the position of the predicted wafer transfer pattern and the process can be realized according to the preset embodiment.

In FIG. 1, the step of forming the exposure mask 4 based on the mask pattern data 2 is inserted. However, when the pattern evaluation process for the exposure mask which is already formed is performed, mask pattern data 2 can be extracted from design data 1 used to form an exposure mask and the mask pattern data may be input.

The positional error correction process based on positional offset is performed for the predicted wafer pattern data 11 or desired wafer pattern data 15. However, it can be performed before formation of the predicted wafer pattern data 11. Specifically, a positional offset value 13 is added to the coordinate values of a line of points configuring the mask pattern contour data 9 after the positional offset measurement and predicted wafer pattern data 11 is created by performing the lithography/simulation process based on the mask pattern contour data having the positional offset value 13 added thereto. At this time, since the positional error correction process is already performed, it is possible to directly compare the desired wafer pattern data 15 with the predicted wafer pattern data 11.

Figure 3:
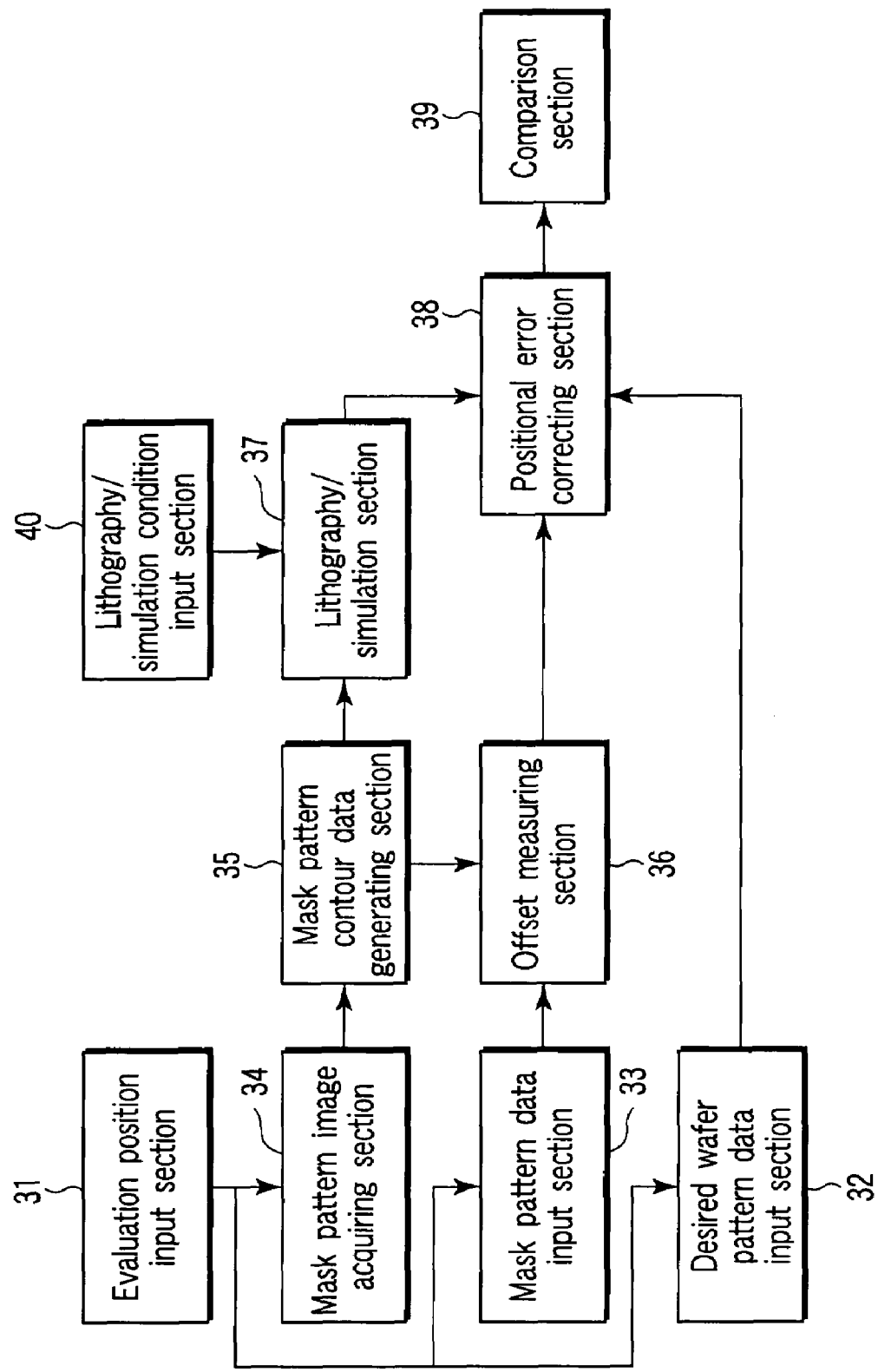
FIG. 3 is a block diagram showing the schematic configuration of a pattern evaluation method according to one embodiment of this invention.

Further, in FIG. 1, the method is explained as the pattern evaluation method. However, a pattern evaluation apparatus which realizes the above method can be configured. In this case, as shown in FIG. 3, the pattern evaluation apparatus may include an evaluation position input section 31 which inputs an evaluation position corresponding to a position of a mask pattern to be evaluated, a desired wafer pattern data input section 32 which inputs desired wafer pattern data indicating the desired form of a wafer transfer pattern corresponding to the evaluation position, a mask pattern input section 33 which inputs mask pattern data corresponding to the evaluation position, an image acquiring section 34 which acquires an image of a mask pattern corresponding to the evaluation position, a contour data generating section 35 which generates mask pattern contour data based on the acquired image of the mask pattern, an offset measuring section 36 which derives positional offset between the mask pattern data and the mask pattern contour data, a lithography/simulation section 37 which performs the lithography/simulation process based on the mask pattern contour data and a parameter input from a lithography/simulation condition input section 40, and generates predicted wafer pattern data indicating the wafer pattern when the mask pattern is transferred to the wafer, a positional error correcting section 38 which corrects a positional error between the desired wafer pattern data and the predicted wafer pattern data based on the positional offset, and a comparison section 39 which compares the desired wafer pattern data with the predicted wafer pattern data with the positional error corrected.

Thus, according to the present embodiment, in the method for evaluating the mask pattern by performing the comparison/measurement process for the desired wafer pattern data and the predicted wafer pattern data obtained by extracting the pattern contour from the image of the mask pattern and performing the lithography/simulation process, the positions of the respective wafer transfer patterns can be precisely aligned by correcting the positional error between the predicted wafer transfer pattern and the desired wafer transfer pattern by use of the positional offset derived by use of the mask pattern data and mask pattern contour data. Therefore, the mask pattern evaluation process can be performed with high precision.

(Modification)

This invention is not limited to the above embodiment. In the embodiment, a case wherein the SEM image is used to acquire the mask pattern image is explained, but this invention is not limited to this case. A method capable of acquiring an image whose pattern can be recognized, for example, an optical image or an image by use of an atomic force microscope (AFM) can be used. Further, in the above embodiment, the positional offset derived between the mask pattern contour data and the mask data is held in order to correct the positional error and the positional error correction process is performed at the time of comparison/measurement for the predicted wafer pattern and the desired wafer pattern, but this invention is not limited to this case. For example, it is possible to previously make a correction so as to set a measurement position to the origin by adding a positional offset value to the coordinate of an apex of polygon data which forms the mask pattern contour data and, as a result, cause the coordinate of the apex of polygon data which forms a predicted wafer pattern to coincide with the measurement value.

Further, in the method described in the embodiment, as a program which can be executed by a computer, for example, a program written into a recording medium such as a semiconductor memory, magnetic disk (Floppy [registered trademark] disk, hard disk or the like) or optical disk (CD-ROM, DVD or the like) can be applied or a program transmitted from a communication medium can be applied to various devices. As a computer which realizes this invention, a computer which reads out a program recorded in the recording medium and whose operation is controlled according to the readout program to perform the above processes can be used.

Further, this invention is not limited only to the pattern evaluation and can be applied to other categories. For example, this invention can be applied to a mask ensured according to whether or not the pattern is within a predetermined range of the specification by the pattern evaluation. In addition, this invention can be applied to a semiconductor device manufactured by use of the evaluated mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer-implemented pattern evaluation method for evaluating a mask pattern, comprising the steps performed by a computer of:
   specifying an evaluation position of a to-be-evaluated portion of a mask pattern formed on an exposure mask;
   generating desired wafer pattern data indicating a desired form of a wafer transfer pattern corresponding to the evaluation position based on design data used to form the exposure mask;
   acquiring an image of a mask pattern corresponding to the evaluation position;
   generating mask pattern contour data based on the acquired image of the mask pattern;
   deriving positional offset between the mask pattern contour data and mask pattern data corresponding to the evaluation position obtained based on the design data;
   performing a lithography/simulation process based on the mask pattern contour data and generating predicted wafer pattern data indicating a form of a wafer transfer pattern when the mask pattern is transferred to a wafer;
   correcting a positional error between the desired wafer pattern data and the predicted wafer pattern data based on the positional offset;
   comparing the desired wafer pattern data with the predicted wafer pattern data with the positional error corrected; and
   outputting a measurement result.

2. The pattern evaluation method according to claim 1, wherein the positional offset value is added to coordinate values of a line of points of at least one of the desired wafer pattern data and predicted wafer pattern data to correct the positional error.

3. The pattern evaluation method according to claim 1, wherein whether the mask pattern is good is determined according to whether a difference between the desired wafer pattern data and the predicted wafer pattern data lies in a permissible range by comparing the desired wafer pattern data with the predicted wafer pattern data.

4. A semiconductor device manufacturing method comprising:
   exposing a pattern onto a semiconductor substrate by use of a photomask which is determined to be good by the pattern evaluation method of claim 3.

5. A computer-implemented pattern evaluation method for evaluating a mask pattern, comprising the steps performed by a computer of:
   specifying an evaluation position of a to-be-evaluated portion of a mask pattern formed on an exposure mask;
   generating desired wafer pattern data indicating a desired form of a wafer transfer pattern corresponding to the evaluation position based on design data used to form the exposure mask;
   acquiring an image of a mask pattern corresponding to the evaluation position;
   generating mask pattern contour data based on the acquired image of the mask pattern;
   deriving positional offset between the mask pattern contour data and mask pattern data corresponding to the evaluation position obtained based on the design data;
   adding the positional offset value to coordinate values of a line of points configuring the mask pattern contour data;
   performing a lithography/simulation process based on the mask pattern contour data having the positional offset value added thereto and generating predicted wafer pattern data indicating a form of a wafer transfer pattern when the mask pattern is transferred to a wafer;
   comparing the desired wafer pattern data with the predicted wafer pattern data; and
   outputting a measurement result.

6. The pattern evaluation method according to claim 5, wherein whether the mask pattern is good is determined according to whether a difference between the desired wafer pattern data and the predicted wafer pattern data lies in a permissible range by comparing the desired wafer pattern data with the predicted wafer pattern data.

7. A semiconductor device manufacturing method comprising:
   exposing a pattern onto a semiconductor substrate by use of a photomask which is determined to be good by the pattern evaluation method of claim 6.

8. A pattern evaluation apparatus which evaluates a mask pattern, comprising:
   an evaluation position input section which inputs an evaluation position corresponding to a to-be-evaluated position of a mask pattern formed on an exposure mask;
   a wafer pattern input section which inputs desired wafer pattern data indicating a desired form of a wafer transfer pattern corresponding to the evaluation position;
   a mask pattern input section which inputs mask pattern data corresponding to the evaluation position;
   an image acquiring section which acquires an image of a mask pattern corresponding to the evaluation position;
   a contour data generating section which generates mask pattern contour data based on the acquired image of the mask pattern;
   an offset calculating section which derives positional offset between the mask pattern data and the mask pattern contour data;

a predicted wafer pattern data generating section which performs a lithography/simulation process based on the mask pattern contour data and generates predicted wafer pattern data indicating a form of the wafer transfer pattern when the mask pattern is transferred to a wafer;

a correcting section which corrects a positional error between the desired wafer pattern data and the predicted wafer pattern data based on the positional offset;

a comparison section which compares the desired wafer pattern data with the predicted wafer pattern data with the positional error corrected; and an output section which outputs a measurement result.

9. The pattern evaluation apparatus according to claim 8, wherein the correcting section adds the positional offset to coordinate values of a line of points of at least one of the desired wafer pattern data and predicted wafer pattern data.

10. The pattern evaluation apparatus according to claim 8, wherein the comparison section determines whether the mask pattern is good according to whether a difference between the desired wafer pattern data and the predicted wafer pattern data lies in a permissible range.

11. A pattern evaluation apparatus which evaluates a mask pattern, comprising:

an evaluation position input section which inputs an evaluation position corresponding to a to-be-evaluated position of a mask pattern formed on an exposure mask;

a wafer pattern input section which inputs desired wafer pattern data indicating a desired form of a wafer transfer pattern corresponding to the evaluation position;

a mask pattern input section which inputs mask pattern data corresponding to the evaluation position;

an image acquiring section which acquires an image of a mask pattern corresponding to the evaluation position;

a contour data generating section which generates mask pattern contour data based on the acquired image of the mask pattern;

an offset calculating section which derives positional offset between the mask pattern data and the mask pattern contour data;

an offset adding section which adds the positional offset to coordinate values of a line of points configuring the mask pattern contour data;

a predicted wafer pattern data generating section which performs a lithography/simulation process based on the mask pattern contour data having the positional offset added thereto and generates predicted wafer pattern data indicating a form of the wafer transfer pattern when the mask pattern is transferred to a wafer;

a comparison section which compares the desired wafer pattern data with the predicted wafer pattern data; and an output section which outputs a measurement result.

12. The pattern evaluation apparatus according to claim 11, wherein the comparison section determines whether the mask pattern is good according to whether a difference between the desired wafer pattern data and the predicted wafer pattern data lies in a permissible range.

13. A computer readable medium configured to store program instruction for execution on a computer, the program instruction causing the computer to perform:

generating desired wafer pattern data indicating a desired form of a wafer transfer pattern corresponding to an evaluation position of a to-be-evaluated portion of a mask pattern formed on an exposure mask;

generating mask pattern contour data based on an image of a mask pattern corresponding to the evaluation position;

deriving positional offset between the mask pattern contour data and mask pattern data corresponding to the evaluation position;

performing a lithography/simulation process based on the mask pattern contour data and generating predicted wafer pattern data indicating a form of a wafer transfer pattern when the mask pattern is transferred to a wafer;

correcting a positional error between the desired wafer pattern data and the predicted wafer pattern data based on the positional offset;

comparing the desired wafer pattern data with the predicted wafer pattern data with the positional error corrected; and outputting a measurement result.

* * * * *